United States Patent [19]

Yamaguchi

[11] 4,389,620

[45] Jun. 21, 1983

[54] CURRENT TRANSFER AMPLIFIER

[75] Inventor: Kazuo Yamaguchi, Kanagawa, Japan

[73] Assignee: Sony Corporation, Tokyo, Japan

[21] Appl. No.: 228,960

[22] Filed: Jan. 27, 1981

[30] Foreign Application Priority Data

Jan. 29, 1980 [JP] Japan .................................. 55-8949
Jan. 29, 1980 [JP] Japan .................................. 55-92908
Jan. 29, 1980 [JP] Japan .................................. 55-9689

[51] Int. Cl.³ .......................... H03F 3/04; H03H 5/00
[52] U.S. Cl. .................................. 330/304; 330/310; 333/28 T
[58] Field of Search ............... 179/1 D; 330/304, 310; 333/28 R, 28 T

[56] References Cited

U.S. PATENT DOCUMENTS 4,292,467  9/1981  Odlen ................................. 179/1 D Primary Examiner—James B. Mullins
Assistant Examiner—Gene Wan
Attorney, Agent, or Firm—Hill, Van Santen, Steadman, Chiara & Simpson

[57] ABSTRACT

A current transfer amplifier includes a voltage signal source for supplying a voltage signal to be amplified, a voltage/current converter for converting the voltage signal from the voltage signal source into a current signal proportional to the voltage signal, a tone control circuit of a current amplification type supplied with the current signal, a non-linear switching element interposed between the output of the voltage/current converter and the input of the tone control circuit to transmit the current signal therethrough, a variable resistor for receiving the current signal to produce a voltage signal proportional to the current signal.

10 Claims, 7 Drawing Figures

CURRENT TRANSFER AMPLIFIER

BACKGROUND OF THE INVENTION

1. Field of the Invention

The present invention relates generally to current transfer amplifier, and is directed more particularly to a current transfer amplifier which will remove the non-linear distortion caused by a switch.

2. Description of the Prior Art

A prior art audio amplifier is of a so-called constant voltage transfer type which uses various signal voltage sources such as a phono-cartridge, tape recorder, tuner or the like and drives the speaker thereof in the form of a voltage, so that the switching and transfer of the signal are all carried out in the voltage mode.

The audio amplifier of the constant voltage type, in which the signal switching (processing) and signal tranfer are carried in the voltage mode, can not be free from the following various problems. That is, before a signal is transmitted or transferred to a power amplifier, the signal passes through many non-linear elements such as a switch and so on. In this case, however, since all the non-linear elements are deemed as a series impedance, the input signal to the power amplifier is determined as the voltage dividing ratio of the impedance. While, when viewed from the input terminal of the power amplifier, a closed loop which terminates at the output impedance is formed. Therefore, an electromotive force is generated by the magnetic flux which passes through the loop area and hence hum and flux at the output stage of the speaker are easily picked up. Further, since a closed loop is formed when viewed from a load terminal, a ground impedance is inserted as a series impedance. Therefore, a return current must be returned to a constant voltage source. It is rather difficult that, in order to reduce the affect by the return current, the ground potentials at a pre-amplifier stage and a power amplifier stage are made coincident. For this reason, there are necessary various counter measures, for example, a bus bar for the ground is used to reduce the series impedance or a shield wire is used for the same purpose. Further, since in the constant voltage type a variable resistor for volume adjustment is of the resistance value dividing type, when the variable resistor for volume adjustment is adjusted as, for example, about ½ in volume i.e. volume is reduced by −6 dB, a noise becomes maximum, namely the S/N ratio becomes worst. Also, even upon a normal using state (the variable resistor for volume adjustment is reduced further from ½), the S/N ratio is deteriorated by about 10 to 20 dB. Thus, there appears such a problem that very unnatural sense is caused in view of hearing.

As described above, the audio amplifier of the constant voltage type proposes various problems. In fact, as the audio amplifier is improved in property, non-linear distortions by the change-over switch, materials of wires and so on become problems. At present, the property of high accuracy or distortion ratio of, for example, about 0.003% is required, so that the non-linear distortion by the changeover switch or material of wires (or relay and so on) can not be neglected.

OBJECTS AND SUMMARY OF THE INVENTION

Accordingly, an object of the present invention is to provide a current transfer amplifier free from the above-mentioned defects.

Another object of the invention is to provide a current transfer amplifier in which a non-linear switching element is current-driven.

In accordance with one example of the present invention, a current transfer amplifier is provided, which includes.

voltage signal source means for supplying a voltage signal to be amplified;

voltage/current converting means supplied with the voltage signal from said voltage source means for converting the same into a current signal proportional to the voltage signal;

a tone control circuit of a current amplification type supplied with the current signal from said voltage/-current converting means;

a non-linear switching element interposed between the output of said voltage/current converting means and the input of said tone control circuit to transmit said current signal therethrough;

a variable resistor having a pair of terminals connected between the output of said tone control circuit and a reference point to convert the output signal of said tone control circuit into voltage signal.

The other objects features and advantages of the present invention will be apparent from the following descriptions taken in conjunction with the attached drawings through which the like references designate the same elements and parts.

DESCRIPTION OF THE PREFERRED EMBODIMENTS

The present invention will be hereinafter described with reference to the attached drawings.

Figure 1:
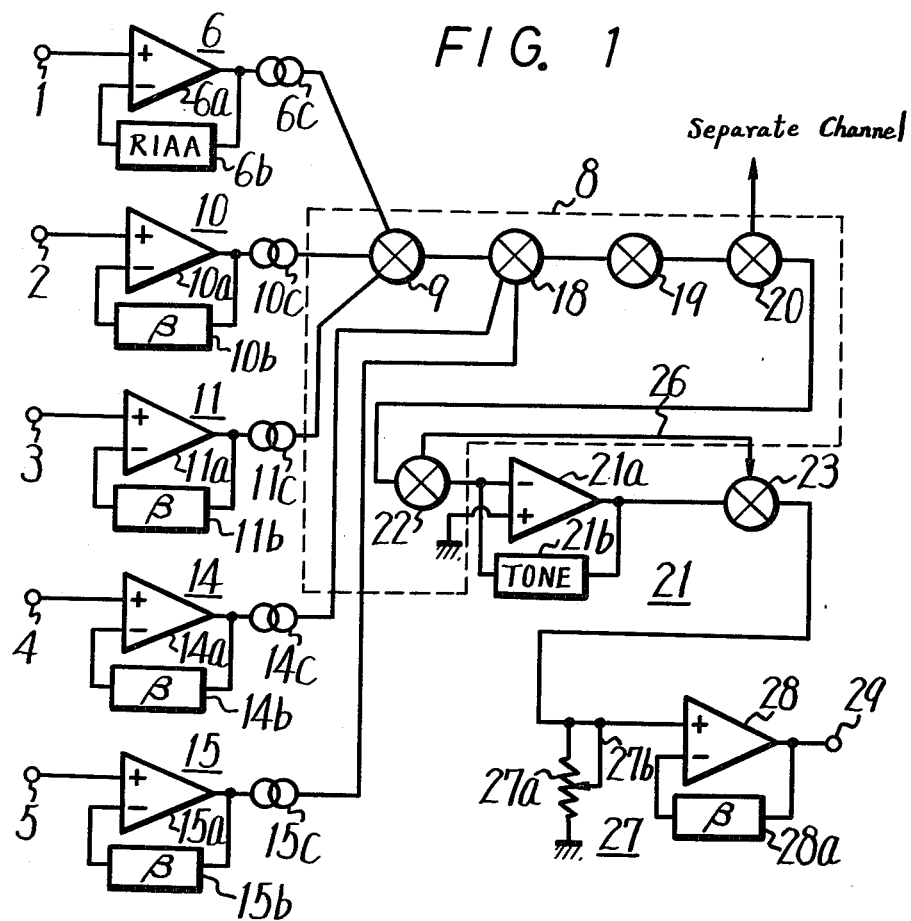
FIG. 1 is a block diagram showing an example of the current transfer amplifier according to the present invention.

FIG. 1 is a block diagram schematically showing an example of the current transfer amplifier according to the present invention. In FIG. 1, reference numerals 1 through 5 each designate input terminals which are respectively supplied with output signals from signal sources though not shown. In this case, by way of example, the input terminal 1 is supplied with the output signal from a phono-cartridge (not shown), the input terminal 2 is supplied with the output signal from a tuner circuit (not shown), the input terminal 3 is supplied with an auxiliary input signal, the input terminal 4 is supplied with the output signal from a first tape recorder (not shown), and the input terminal 5 is supplied with the output signal from a second tape recorder (not shown).

The phono-output supplied to the input terminal 1 is applied to an equalizer amplifier 6 of the current amplification type, which will be described later, converted thereby from the voltage signal to the corresponding current signal, and then fed to a function switch 9 of a non-linear switch means 8. The tuner output and the auxiliary input applied to the input terminals 2 and 3 are respectively applied to flat amplifiers 10 and 11 of the current amplification type, which will be described later, converted from the voltage signals to the corresponding current signals, and then fed to the function switch 9. The outputs of the first and second tape recorders applied to the input terminals 4 and 5 are respectively applied to flat amplifiers 14 and 15 of the current amplification type, converted from the voltage signals to the corresponding current signals, and then fed to a tape monitor switch 18 provided in the switch means 8 and supplied with the output of the function switch 9.

The input signals fed to the input terminals 1 to 3 are selected by the function switch 9, and a desired one of the outputs from the tape recorders is selected by turning the tape monitor switch 18 ON, and they are then processed. The processed signals through the switches 9 and 18 are desirably changed over by respectively making ON a tape copy switch 19 and a mode switch 20 provided at the next stage of the switch 18. The signal passed through the mode switch 20 is applied to a tone control circuit 21 which consists of tone control switches 22 and 23 provided at the input and output sides thereof, a tone control amplifier 21a of the current amplification type with a feedback circuit 21b, which is provided between the switches 22 and 23 and will be described later, and a signal transmission path 26 directly connecting the switches 22 and 23.

When the tone control is carried out, the current signal is applied to the amplifier 21a of the current amplification type to vary its gain before and after, for example, 1 KH$_z$. While, no tone control is carried out, the switches 22 and 23 are so changed over that the tone control amplifier 21a is short-circuited (or tone-cancelled) by the signal transmission path 26.

As set forth above, the respective signals, which are converted in the amplifiers 6, 10, 11, 14 and 15 from the voltage signals to the current signals, are supplied to the switch means 8, signal-processed in the current mode and then sequentially supplied to the tone control circuit 21.

The tone control circuit 21 is also a current amplifier and the output therefrom is applied to a variable resistor 27 provided at the output side thereof. Although this variable resistor 27 is similar to a variable resistor of the normal resistance division type in view of construction, its operation is different from that of the normal variable resistor since the output from the tone control circuit 21 is a current signal. That is, the variable resistor of the normal voltage division type delivers the potential generated between its movable piece and the ground as an input signal (voltage signal) for the next state. However, in the example of the invention shown in FIG. 1, the output terminal of a movable piece 27b of the variable resistor 27 is connected commonly to one end (signal input terminal) of its resistor member 27a and the movable piece 27b is slided on the resistor member 27a to vary its resistance value to thereby convert the current signal to a voltage signal which will be applied to an ordinary power amplifier 28 with a feedback circuit 28a provided at the next stage of the variable resistor 27. In other words, the resistor 27 whose resistance value itself is varied, is provided at the input side of the power amplifier 28 to control its input level. The voltage signal applied to the power amplifier 28 is amplified thereby as a large voltage signal and then delivered to an output terminal 29. If a speaker (not shown), by way of example, is connected to the output terminal 29, the output from the power amplifier 28 is sounded.

Now, examples of the voltage/current converter useable in the invention will be described in detail with respect to FIGS. 2 to 4.

Figure 2:
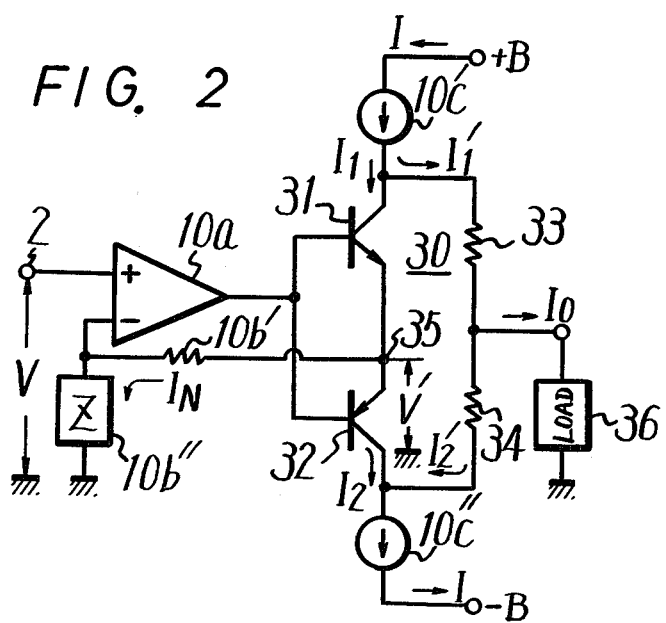
FIGS. 2 to 4 are respectively connection diagrams each showing a voltage/current converter.

FIG. 2 shows an example of the voltage/current converter which is used as the flat amplifier 10 of the current amplification type shown in FIG. 1. In FIG. 2, the elements and parts corresponding to those of FIG. 1 are marked with the same references.

In the example of FIG. 2, at the output side of an operational amplifier 10a, provided is a bridge circuit 30 which consists of transistors 31 and 32 different in the conductivity type and resistors 33 and 34. The bases of the transistors 31 and 32 are connected together to the output terminal of the operational amplifier 10a, and the transistors 31 and 32 are operated alternately in response to the voltage signal applied to the input terminal 2. The emitters of the transistors 31 and 32 are connected commonly to provide a common connection point 35. This common connection point 35 is connected through a resistor 10b', which will form a part of a feedback circuit 10b shown in FIG. 1, to the inverted input terminal of the operational amplifier 10a and also through a feedback impedance 10b'', which will form another part of the feedback circuit 10b, to the ground. This feedback impedance 10b'' may be a mere resistor or an impedance circuit made of other parts. That is, these resistor 10b' and feedback impedance 10b'' form the feedback circuit 10b of a so-called feedback ratio $\beta$. Now, if the voltage produced between the common connection point 35 and the ground is taken as V', this voltage V' is divided by the resistor 10b' and the feedback impedance 10b'', and the voltage across the feedback impedance 10b'' is applied to the inverted input terminal of the operational amplifier 10a as the feedback signal.

The collector of the transistor 31 is connected through a constant current source 10c' to a positive power supply terminal +B and also to one end of a resistor 33 directly, while the collector of the transistor 32 is connected through a constant current source 10c'' to a negative power supply terminal −B and also to one end of a resistor 34 directly which has the same resistance value as that of the resistor 33. The other ends of the resistors 33 and 34 are connected together to the ground through a load circuit 36.

Now, if it is assumed that the voltage at the input terminal 2 is taken as V, the resistance value of the resistor 10b' as R and the impedance of the feedback impedance 10b'' as Z, the voltage V' appeared between the common connection point 35 and the ground becomes as expressed by the following formula (1).

$$V' = \frac{R + Z}{Z} \cdot V \tag{1}$$

Now, if the feedback current flowing through the resistor 10b' and feedback impedance 10b'' is taken as I$_N$, the voltage V' can be expressed as follows:

$$V = (R+Z)I_N \quad (2)$$

From the formulae (1) and (2), the following formula (3) is derived.

$$(I_N/V) = (1/Z) \quad (3)$$

While, if the current amplification factors ($h_{fe}$) of the transistors 31 and 32 are equal with each other, a current I flowing through the constant current sources 10c' and 10c'' is expressed as follows:

$$I = I_1 + I_1' = I_2 + I_2' \quad (4)$$

where $I_1$ and $I_2$ represent the currents respectively flowing through the transistors 31 and 32, and $I_1'$ and $I_2'$ represent the currents respectively flowing through the resistors 33 and 34.

Further, the feedback current $I_N$ and a load current $I_O$ are respectively expressed as follows:

$$I_N = I_1 - I_2 \quad (5)$$

$$I_O = I_1' - I_2' \quad (6)$$

Since $I_1 - I_2 = I_2' - I_1'$40 is established from the formula (4), the following formula (7) is obtained from the above formulae (5) and (6).

$$I_N = -I_O \quad (7)$$

If this formula (7) is substituted into the formula (3), the following formula (8) is obtained.

$$I_O = -(V/Z) \quad (8)$$

The current signal expressed by the formula (8) i.e. load current $I_O$ has no relation to the power supply voltages ±B and depends upon only the impedance value Z of the feedback impedance 10b'' and the input voltage V. That is, the derived current signal is the complementary current to that flowing through the feedback circuit 10b with the feedback ratio β, so that the conversion accuracy of the voltage to current becomes very good.

Also, since the output stage of the converter shown in FIG. 2 is the bridge circuit which employs the constant current sources, when viewed from the power supply side, no current variation appears in the output stage. Accordingly, the converter is not affected any by the fluctuation of the power supply voltage and hence can be used as the equalizer amplifier 6 of the current amplification type and the flat amplifiers 10 to 15 shown in FIG. 1 with good effects.

Figure 3:
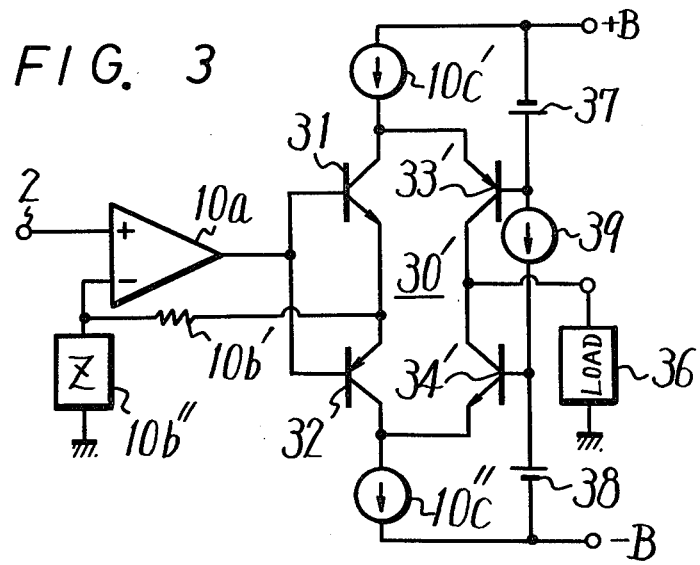

FIG. 3 shows another example of the voltage/current converter which is also useable in this invention. In FIG. 3, the elements and parts corresponding to those of FIG. 2 are marked with the same references and their description will be omitted for the sake of brevity.

The difference point between the examples of FIGS. 2 and 3 resides in that, in the example of FIG. 3, in place of the resistors 33 and 34 forming the parts of the bridge circuit 30 of FIG. 2, transistors 33' and 34', each of which is of the base grounded type, are used to form a part of a bridge circuit 30'. In detail, the transistors 33' and 34' have the emitters respectively connected to the collectors of the transistors 31 and 32, the collectors connected together to the load circuit 36, and the bases respectively connected through bias sources 37 and 38 to the power supply terminals +B and 31 B, and a constant current source 39 is inserted between the bases of the transistors 33' and 34'.

In the example shown in FIG. 3, since the transistors 33' and 34' are both of the base grounded configuration, the current gains thereof are both 1 and hence the variations of the currents flowing through, for example, the collectors of the transistors 31 and 32 become substantially equal.

By constructing the converter as described above in connection with FIG. 3, this converter performs the effect substantially same as that of the first example and also such an effect to deliver the output effectively.

Figure 4:
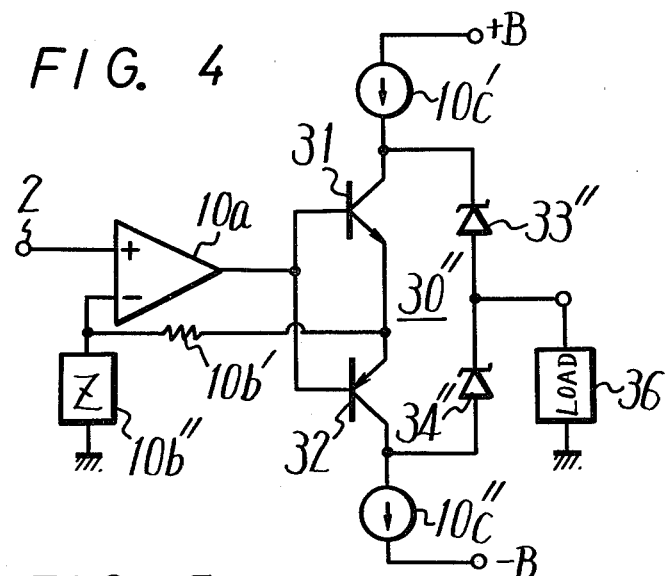

FIG. 4 shows a further example of the voltage/current converter which is also useable in the invention. In FIG. 4, the elements and parts corresponding to those of FIG. 2 are marked with the same references and their detailed explanation will be omitted for the sake of simplicity.

The difference point between the examples of FIGS. 2 and 4 resides in that, in this example, in place of the resistors 33 and 34 forming the parts of the bridge circuit 30 shown in FIG. 2, constant voltage elements such as Zener diodes 33'' and 34'' are respectively used to form the corresponding parts of a bridge circuit 30''. That is, in the example of FIG. 4, the cathode of the Zener diode 33'' and the anode of the Zener diode 34'' are respectively connected to the collectors of the transistors 31 and 32, and the anode of the Zener diode 33'' and the cathode of the Zener diode 34'' are connected together to the load circuit 36.

By constructing the converter as shown in FIG. 4, this converter can perform the effect substantially same as that of FIG. 2 and further produce such an output which depends on the withstanding voltages of the Zener diodes 33'' and 34'' and is larger than that of the example shown in FIG. 2 by suitably selecting the withstanding voltages of the Zener diodes 33'' and 34''.

The above examples of the voltage/current converter can be all also used as the equalizer amplifier 6 shown in FIG. 1.

Now, the fundamental construction of the current amplication type tone control circuit, which can be used in the invention will be described with reference to FIG. 5.

Figure 5:
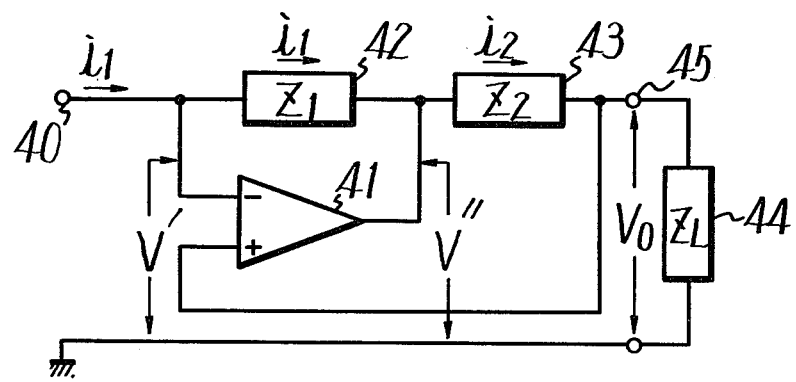
FIGS. 5 and 6 are connection diagrams respectively showing tone control circuits of a current amplification type used in the invention.

In FIG. 5, 41 designates an amplifier which comprises a first impedance circuit 42 inserted between its first input terminal, for example, inverted input terminal and its output terminal and a second impedance circuit 43 inserted between its second input terminal, for example, non-inverted input terminal and an output terminal 45. The common connection point between the inverted input terminal of the amplifier 41 and the first impedance circuit 42 is connected to an input terminal 40 and the output terminal 45 is connected in series to a load 44.

It it is assumed that the differential input impedance of the amplifier 41 is sufficiently large and the amplification factor thereof is taken as A, the following formulae (9) and (10) are respectively established.

$$V'' = V' - Z_1 \cdot i_1 = (V_O - V')A \quad (9)$$

$$V' - V_O = Z_2 \cdot i_2 \quad (10)$$

Where $V''$ is the output voltage of the amplifier 41; $V'$ is the input voltage to the inverted input terminal of the amplifier 41; $Z_1$ and $Z_2$ are respectively the impedances of the impedance circuits 42 and 43; $V_O$ is the voltage produced across the load 44; and $i_1$ and $i_2$ are respectively the currents flowing through the impedance circuits 42 and 43.

From the right side of the formula (9), the following formula (11) is derived.

$$V = (A \cdot V_O + Z_1 \cdot i_1)/(1+A) \tag{11}$$

Further, when the above formula (9) is substituted into the formula (10), the following formula (12) is obtained.

$$Z_2 \cdot i_2 = (V_O - V)A - V_O = (A-1)V_O - A \cdot V \tag{12}$$

Also, when the formula (11) is substituted into that (12), the following formula (13) is derived.

$$Z_2 \cdot i_2 = (A-1)V_O - A(A \cdot V_O + Z_1 \cdot i_1)/(1+A) \tag{13}$$

$$= -\frac{V_O}{1+A} - \frac{A \cdot Z_1 \cdot i_1}{1+A}$$

If A is made $\infty$ in the formula (13), the following formula (14) is obtained.

$$Z_2 \cdot i_2 = -Z_1 \cdot i_1 \tag{14}$$

From the above formula (14), the current transfer function of the circuit shown in FIG. 5 is expressed as follows:

$$(i_2/i_1) = -(Z_1/Z_2) \tag{15}$$

That is, it could be understood that the circuit of FIG. 5 operates as a current amplifier.

At this time, the voltage $V_O$ appearing across the load 27, which corresponds to the variable resistor 27 in the example of FIG. 1, becomes as follows:

$$V_O = i_2 \cdot Z_L \tag{16}$$

where $Z_1$ is the impedance value of the load 44.

From the above formula (16), it would be understood that, according to the circuit of FIG. 5, even though non-linear elements such as the impedance circuits 42 and 43, diode and so on are used at the side of the load 44, the circuit is free from the non-linear distortion and so on.

Figure 6:
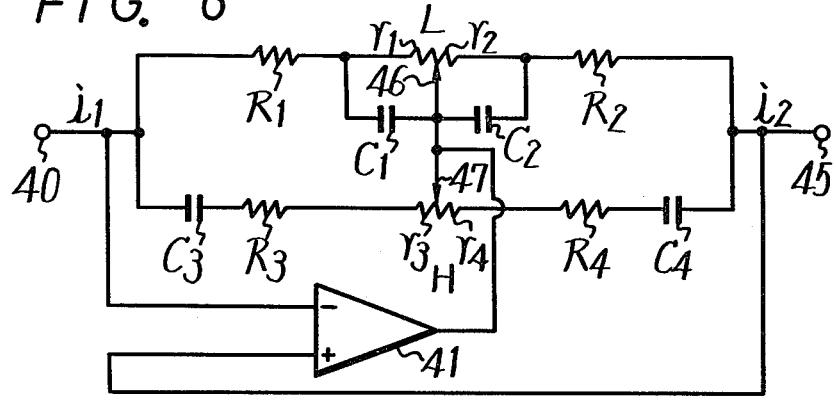

FIG. 6 shows an example in which the circuit shown in FIG. 5 is applied to the tone control circuit 21 shown in FIG. 1. In FIG. 6, in order to facilitate the explanation, the respective circuit elements are marked with their resistance values and capacitance values, and reference letters L and H respectively represent low and high frequency band compensating portions.

In the example of FIG. 6, if the impedance values $Z_1$ and $Z_2$ are calculated in correspondence with the example of FIG. 5, they are expressed as follows:

$$Z_1 = \left( R_1 + r_1 // \frac{1}{j\omega c_1} \right) // \left( \frac{1}{j\omega c_3} + R_3 + r_3 \right) \tag{17}$$

$$Z_2 = \left( R_2 + r_2 // \frac{1}{j\omega c_2} \right) // \left( \frac{1}{j\omega c_4} + R_4 + r_4 \right) \tag{18}$$

At this time, the current transfer function is expressed as follows:

$$(i_2/i_1) = -(Z_1/Z_2) \tag{19}$$

Upon the low frequency band compensation, a movable piece 46 of a variable resistor of the low frequency compensating portion L is moved to the right to thereby make the impedance value $Z_2$ small. In other words, the current transfer becomes good and hence the current increases to boost the low frequency characteristic. While, when the movble piece 46 is moved to the left, the impedance value $Z_2$ increases. Thus, the current transfer becomes bad, hence the current decreases and accordingly the low frequency characteristic is cut.

While, upon the high frequency band compensation, the movable piece 47 is moved to the right to make the impedance $Z_2$ small, or the current transfer becomes good, the current increases and hence the high frequency band characteristic is boosted. When the movable piece 47 is moved to the left, the impedance $Z_2$ becomes large or the current transfer becomes poor. Thus, the current decreases, and accordingly the high frequency characteristic is cut.

Therefore, it will be understood that the circuit of FIG. 6 can easily represent desired total characteristics in which the low and high frequency bands for the tone control are compensated and becomes the tone control circuit of the current amplification type.

Figure 7:
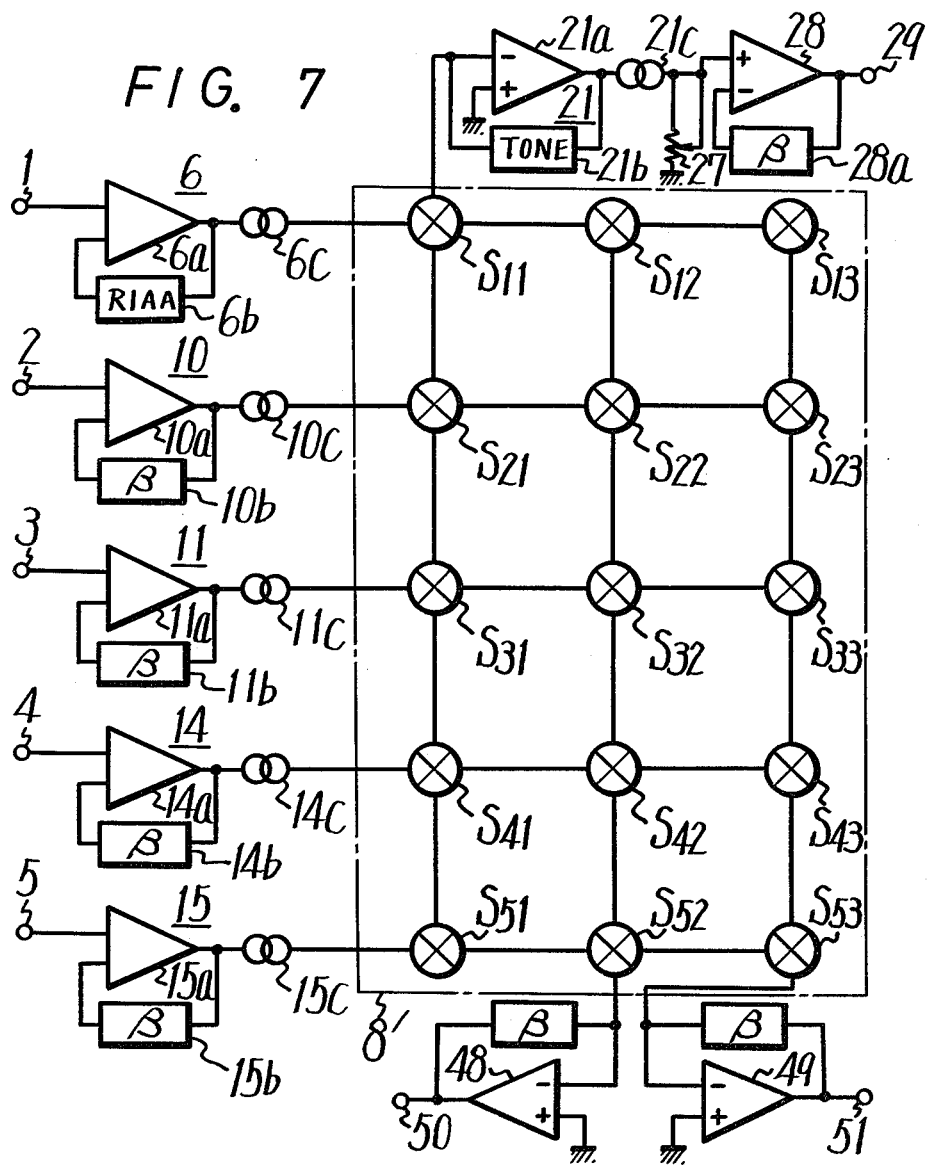
FIG. 7 is a block diagram showing another example of the invention.

FIG. 7 shows another example of the current transfer amplifier according to the invention, in which the elements and parts corresponding to those of FIG. 1 are marked with the same references and their detailed description will be omitted.

In this example, in place of the switch means 8 shown in FIG. 1, employed is a switch means 8' which includes switches $S_{11}$ to $S_{13}$; $S_{21}$ to $S_{23}$; $S_{31}$ to $S_{33}$; $S_{41}$ to $S_{43}$; and $S_{51}$ to $S_{53}$, and these switches are desirably opened and closed to present a desired function mode. In the example of FIG. 7, the switches $S_{11}$ to $S_{53}$ are arranged in a matrix pattern at the output sides of the respective constant current sources 6c, 10c, 11c, 14c and 15c. In this case, as set forth above, for example, the signal for driving the speaker (not shown) is derived through the switch $S_{11}$ to the output terminal 29, and the first and second tape recorder outputs are respectively derived through the switches $S_{52}$ and $S_{53}$ and then through inverted type feedback amplifiers 48 and 49 to output terminals 50 and 51. Since the respective signals, which are transferred through the circuit, are currents, they are not affected by the non-linear distortions of the respective switches $S_{11}$ to $S_{53}$. When the switches $S_{11}$ to $S_{53}$ are opened and closed desirably, the respective signals may be mixed.

As described above, according to the present invention the change-over and transfer of the internal signals are carried out in the form of the constant current system, so that the current flowed into the load resistor i.e. variable resistor 27 is not affected any by the serially inserted impedance. Therefore, the non-linear distortion caused by the switches, grounded impedance and so on can be neglected, and a solid wire, which is much expensive as compared with a shield wire, is sufficient for wiring.

Further, with the constant current transfer system, if only the current is transferred accurately, the signal can be reproduced at the variable resistor 27 serving as the load in the accurate voltage mode. Therefore, it is needless to consider the grounded impedance through which the return current flows as in the constant voltage transfer system. In other words, as set forth above, since the ground potential at the pre-amplifier portion is generally different from that at the power amplifier portion, the counter measure for reducing the affection by the return current is required in the constant voltage transfer system. In the constant current transfer system, however, the grounded impedance itself through which the return current flows is not necessary to be considered as set forth above, so that it is of no need to take the influence of the return current into account and hence the signal can be transferred accurately.

In the examples of the invention, at the input terminal of the power amplifier 28 which serves as the circuit to finally convert the current signal into the voltage signal, provided is the variable resistor 27 with a relatively small resistance value, such as 10K$\phi$, so that the examples are advantageous in view of noise. Further, as the sound volume by the variable resistor 27 is lowered, its resistance value is decreased and the noise is reduced (the thermal noise is in proportion to the resistance value). Therefore, a natural sound volume in view of acoustic sense can be obtained.

Further, when the sound volume is lowered to about ½ in the constant voltage transfer system as described above, the resistance value of the resistor becomes maximum. Accordingly, the S/N ratio is deteriorated in the normal using state. According to the constant current transfer system of the present invention, however, the resistance value of the variable resistor 27 is reduced in correspondence with the lowering of the sound volume and the thermal noise is also decreased. Therefore, according to the invention, the S/N ratio is not deteriorated especially in the ordinary using state where the sound volume is lowered, and hence natural sound is produced in view of acoustic sense.

In addition, according to the invention, the change-over and transfer of the signals are carried out in the current mode, so that the signals can be mixed freely by opening and closing a plurality of the switches suitably.

The above examples are the cases that the phono-cartridge, tuner or the like is used as the respective signal source before the current conversion, but the present invention can be applied to a case where the other signal sources as used with the same effect.

Further, it is of no need that the respective switches used as the switch means 8 are limited to the abovementioned ones, but the other switches of the function mode may be used.

In the above examples, the inverted type constant current amplifier 21a of the tone control circuit 21 may be a same phase type constant current amplifier.

Further, in the above example the same phase type amplifier is used as the pre-amplifier 28, but in fact the amplifier located at the rear stage of the variable resistor 27 may be of the same phase type or inverted type, and this amplifier is not limited to the power amplifier but may be other type of amplifiers.

It will be apparent that many modifications and variations could be effected by one skilled in the art without departing from the spirits or scope of the novel concepts of the present invention so that the spirits or scope of the invention should be determined by the appended claims only.

I claim as my invention:
1. A current transfer amplifier comprising:
  voltage signal source means for supplying a voltage signal to be amplified;
  voltage/current converting means supplied with the voltage signal from said voltage source means for converting the samed into a current signal proportional to the voltage signal;
  a tone control circuit of a current amplification type supplied with the current signal from said voltage/current converting means;
  a non-linear switching element interposed between the output of said voltage/current converting means and the input of said tone control circuit to transmit said current signals therethrough; and
  a variable resistor having a pair of terminals connected between the output of said tone control circuit and a reference point to convert the output signal of said tone control circuit into voltage signal.

2. A current transfer amplifier according to claim 1, further including a tone cancel circuit to disable said tone control circuit.

3. A current transfer amplifier according to claim 2, in which said tone cancel circuit comprises:
  a signal transmitting path; and
  first and second change-over switches to shunt the output signal of said voltage/current converting means to said variable resistor through said signal transmitting path.

4. A current transfer amplifier according to claim 3, in which one of said first and second change-over switches forms said non-linear switching element.

5. A current transfer amplifier according to claim 1, in which said voltage signal source includes a plurality of voltage signals to be amplified and one of the plurality of voltage signals is selectively supplied to said tone control circuit by a function change-over switch which forms said non-linear switching element.

6. A current transfer amplifier according to claim 1, in which voltage/current converting means comprises:
  DC voltage source having a pair of terminals;
  an operational amplifier having positive and negative input terminals and an output terminal, said positive terminal being supplied with the voltage signal of said voltage signal source means;
  first and second transistors, each having an input electrode connected to the output terminal of said operational amplifier, the main current path thereof being connected between the pair of terminals of said DC voltage source through first and second constant current sources, respectively;
  feed back circuit means connected between the connection point of said first and second transistors and the negative input terminal of said operational amplifier;
  a series connection circuit of first and second impedance means, said series connection circuit being connected between the connections point of said first constant current source and said first transistor and the connection point of said second constant current source and said second transistor; and
  an output terminal connected to the connection point of said first and second impedance means to produce a current signal proportional to said voltage signal.

7. A current transfer amplifier according to claim 6, in which each of said first and second impedance means comprises a resistor.

8. A current transistor amplifier according to claim 6, in which said first and second impedance means comprise main current paths of third and fourth transistors, each having an input electrode connected to a biasing voltage source.

9. A current transfer amplifier according to claim 6, in which each of said first and second impedance means comprises a Zener diode.

10. A current transfer amplifier according to claim 1, in which said tone control circuit of a current amplification type comprises:

an input terminal supplied with said current signal from said voltage/current converting means;

a signal output terminal to produce a tone controlled output;

an operational amplifier having positive and negative input terminals and an output terminal, said negative input terminal being connected to said input terminal;

a first impedance network connected between the negative input terminal and the output terminal of said operational amplifier;

a second impedance network connected between the output terminal of said operational amplifier and said signal output terminal; and circuit means for connecting the positive input terminal of said operational amplifier to said signal output terminal; and in which the impedance value of said first and second impedance networks is controlled to obtain bass and treble tone control characteristics.

* * * * *